(12) United States Patent
Aisaka et al.

(10) Patent No.: US 11,652,218 B2
(45) Date of Patent: May 16, 2023

(54) SEPARATOR AND METHOD FOR MANUFACTURING SEPARATOR

(71) Applicant: TOYOTA JIDOSHA KABUSHIKI KAISHA, Toyota (JP)

(72) Inventors: Takashi Aisaka, Nisshin (JP); Hitoshi Tanino, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 82 days.

(21) Appl. No.: 17/501,242

(22) Filed: Oct. 14, 2021

(65) Prior Publication Data

US 2022/0123326 A1    Apr. 21, 2022

(30) Foreign Application Priority Data

Oct. 16, 2020   (JP) .............................. JP2020-174915

(51) Int. Cl.
*H01M 8/0208* (2016.01)
*H01M 8/0228* (2016.01)

(52) U.S. Cl.
CPC ....... *H01M 8/0208* (2013.01); *H01M 8/0228* (2013.01)

(58) Field of Classification Search
CPC .......................... H01M 8/0208; H01M 8/0228
USPC ........................................................ 429/513
See application file for complete search history.

(56) References Cited

U.S. PATENT DOCUMENTS

| | | | |
|---|---|---|---|
| 2012/0088185 A1* | 4/2012 | Maeda | H01M 8/0228 72/46 |
| 2016/0087287 A1 | 3/2016 | Koizumi | |
| 2018/0309136 A1* | 10/2018 | Vieluf | H01M 4/8825 |
| 2018/0337414 A1* | 11/2018 | Takata | H01M 8/0228 |
| 2021/0032740 A1* | 2/2021 | Yi | C23C 14/352 |
| 2021/0066729 A1* | 3/2021 | Kaminaka | C23C 28/046 |

FOREIGN PATENT DOCUMENTS

| | | | | |
|---|---|---|---|---|
| EP | 3565042 A1 * | 11/2019 | | C23C 8/12 |
| JP | 2010-129303 A | 6/2010 | | |
| JP | 2010-153353 A | 7/2010 | | |
| JP | 2012-160382 A | 8/2012 | | |
| JP | 2016-062837 A | 4/2016 | | |
| JP | 2019-214781 A | 12/2019 | | |

* cited by examiner

*Primary Examiner* — James M Erwin
(74) *Attorney, Agent, or Firm* — Sughrue Mion, PLLC

(57) ABSTRACT

Provided are a low-price fuel cell separator with high corrosion resistance and a method for manufacturing the separator. The present disclosure relates to a fuel cell separator including a metal substrate and a titanium layer containing titanium formed on the metal substrate, and a method for manufacturing the separator. A ratio of a (100) plane to a sum of values obtained by dividing peak intensities of the (100) plane, a (002) plane, and a (101) plane derived from titanium in an X-ray diffraction analysis of a separator surface by respective relative intensities is a constant value or more.

6 Claims, 20 Drawing Sheets

Protruding Portion (4)

Oblique Portion (5) between Protruding Portion and Recessed Portion

Recessed Portion (6)

| Bias Voltage (-V) | Oblique Portion Film Thickness (nm) |
|---|---|
| 300 | 147.8 |
| 400 | 108.4 |
| 500 | 69.0 |
| 600 | 29.5 |
| 700 | -9.9 | ns
SEPARATOR AND METHOD FOR MANUFACTURING SEPARATOR

CROSS REFERENCE TO RELATED APPLICATIONS

The present application claims priority from Japanese patent application JP 2020-174915 filed on Oct. 16, 2020, the entire content of which is hereby incorporated by reference into this application.

BACKGROUND

Technical Field

The present disclosure relates to a separator and a method for manufacturing the separator, specifically a fuel cell separator and a method for manufacturing the fuel cell separator.

Description of Related Art

A fuel cell device has a stack structure in which a predetermined number of unit cells are stacked, and the unit cell generates an electromotive force through a reaction between a fuel gas (hydrogen) and an oxidant gas (oxygen). The unit cell includes a membrane electrode assembly and separators. The membrane electrode assembly includes an anode electrode layer and a cathode electrode layer (the respective electrode layers have catalyst layer and gas diffusion layer) on both surfaces of an electrolyte membrane. The separators are disposed on respective both surfaces of the membrane electrode assembly.

The separator has a function of electrically connecting the unit cells in series and a function as a partition wall mutually blocks the fuel gas, the oxidant gas, and a cooling water.

Various studies have been conducted on such a separator.

For example, JP 2010-153353 A discloses an electrically conductive member that includes a metal substrate layer and an electrically conductive carbon layer, which is positioned on at least one principal surface of the metal substrate layer and contains an electrically conductive carbon. In the electrically conductive member, an intensity ratio R ($I_D/I_G$) of a D-band peak intensity ($I_D$) to a G-band peak intensity ($I_G$) measured by a Raman scattering spectroscopic analysis of the electrically conductive carbon layer is 1.3 or more. Furthermore, the electrically conductive member includes a middle layer having a columnar structure interposed between the metal substrate layer and the electrically conductive carbon layer.

JP 2010-129303 A discloses an electrically conductive member that includes a metal substrate layer, a dense barrier layer formed on the metal substrate layer, a middle layer formed on the dense barrier layer, and an electrically conductive thin membrane layer formed on the middle layer. Furthermore, the middle layer in the electrically conductive member has a columnar structure with a high crystal orientation.

JP 2019-214781 A discloses a titanium material as a material of a fuel cell separator that includes a matrix material made of pure titanium, a titanium oxide film formed on the matrix material, and a carbon material layer formed on the titanium oxide film. In a thin film X-ray diffraction analysis of a superficial layer of the titanium material with an incident angle of 0.3°, I(002)/I(101) is 0.8 or more and c/a is 1.598 or more. The titanium oxide film contains one or more of C and N (note that I(101): peak intensity of (101) plane of α-Ti phase, I(002): peak intensity of (002) plane of α-Ti phase, a: lattice constant in a-axis direction of α-Ti phase, c: lattice constant in c-axis direction of α-Ti phase).

SUMMARY

A fuel cell separator plays a role of flowing a generated current to a next cell. Therefore, a substrate constituting the separator requires a high conductive property. Furthermore, a high corrosion resistance is also required to keep the high conductive property for a long period of time even in a high temperature and acidic atmosphere inside cells of a fuel cell device.

Therefore, pure titanium or a titanium alloy is often used for a substrate constituting the separator, and this is one of major factors of cost increase in manufacturing the separator.

Accordingly, for manufacturing a low-price fuel cell separator with a high conductive property and a high corrosion resistance, it is considered that a low-price material is used for a metal substrate, a titanium layer (middle layer) for ensuring the corrosion resistance is formed on a surface of the metal substrate, and a conductive layer (surface layer) for ensuring the conductive property is formed on a surface of the middle layer.

However, there is a room for improving the corrosion resistance in the fuel cell separator in which the titanium layer and the conductive layer are formed.

Accordingly, the present disclosure provides a low-price fuel cell separator with a high corrosion resistance and a method for manufacturing the separator.

The present inventors examined various means to solve the problem, and found the following. In a fuel cell separator in which a titanium layer containing titanium is formed on a metal substrate, by dividing respective peak intensities of a (100) plane, a (002) plane, and a (101) plane, which are derived from titanium, obtained by an X-ray diffraction analysis (XRD) of a separator surface by respective relative intensities ("theoretical diffraction intensity" in other words) of the crystal lattice planes ("lattice plane," "diffraction plane" in other words), (peak intensity/relative intensity) was obtained for each peak; and the corrosion resistance of the fuel cell separator was increased when a ratio (orientation ratio) of (peak intensity/relative intensity) of the (100) plane to a sum of (peak intensity/relative intensity)s of the (100) plane, the (002) plane, and the (101) plane became a constant value or more. Thus, the inventors achieved the present disclosure.

That is, the gist of the present disclosure is as follows.

(1) A fuel cell separator comprising a metal substrate and a titanium layer containing titanium formed on the metal substrate. A ratio of a (100) plane to a sum of values obtained by dividing peak intensities of the (100) plane, a (002) plane, and a (101) plane derived from titanium in an X-ray diffraction analysis of a separator surface by respective relative intensities is 16.9% or more.

(2) In the fuel cell separator according to (1), a ratio of the (002) plane to the sum of the values obtained by dividing the peak intensities of the (100) plane, the (002) plane, and the (101) plane derived from titanium in the X-ray diffraction analysis of the separator surface by the respective relative intensities is 61.0% or less.

(3) In the fuel cell separator according to (1) or (2), the metal substrate is a stainless steel.

(4) A method for manufacturing a fuel cell separator including a metal substrate and a titanium layer containing titanium formed on the metal substrate. The titanium layer is formed on the metal substrate using a sputtering method under a condition of: (a) a UBM coil current value is 6.5 A to 10 A; or (b) a bias voltage value to the metal substrate is more than −700 V and −150 V or less.

(5) In the method according to (4), the metal substrate has an uneven shape.

The present disclosure provides a low-price fuel cell separator with a high corrosion resistance and a method for manufacturing the separator.

DETAILED DESCRIPTION OF THE EMBODIMENTS

Figure 1A:
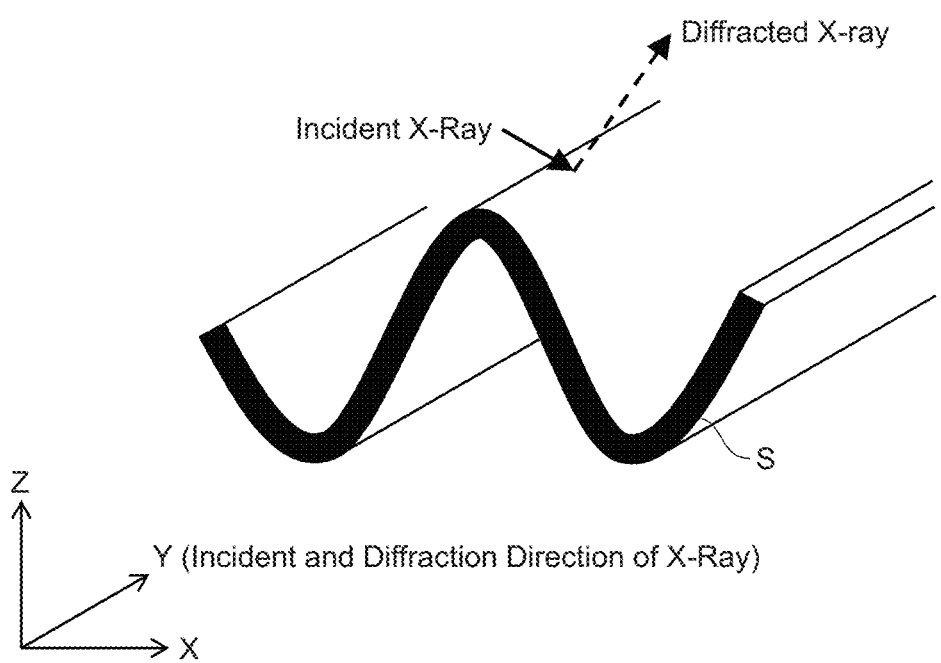
FIG. 1A is a schematic diagram illustrating an appropriate example in a measuring method of an X-ray diffraction analysis of a separator surface having a channel shape.

The following describes embodiments of the present disclosure in detail.

In this description, features of the present disclosure will be described with reference to the drawings as necessary. In the drawings, dimensions and shapes of respective components are exaggerated for clarification, and actual dimensions and shapes are not accurately illustrated. Accordingly, the technical scope of the present disclosure is not limited to the dimensions and the shapes of respective components illustrated in the drawings. Note that, a separator and a method for manufacturing the separator of the present disclosure are not limited to the embodiments bellow, and can be performed in various configurations where changes, improvements, and the like which a person skilled in the art can make are given without departing from the gist of the present disclosure.

The present disclosure relates to a fuel cell separator in which a titanium layer containing titanium is formed on a metal substrate, and a method for manufacturing the fuel cell separator. The fuel cell separator has a ratio (orientation ratio) of a (100) plane to a sum of values obtained by dividing peak intensities of the (100) plane, a (002) plane, and a (101) plane, derived from titanium in an X-ray diffraction analysis of a separator surface, by respective relative intensities, which is a constant value or more.

The fuel cell separator of the present disclosure includes the titanium layer containing titanium formed on the metal substrate.

Here, the metal substrate is a metal substrate made of a material lower-priced than titanium. The metal substrate includes a plate-shaped substrate made of a stainless steel [SUS (iron, chromium, nickel)], iron, or the like. The metal substrate is made of a stainless steel in some embodiments.

The stainless steel includes SUS316 and SUS316L with high corrosion resistance, and low-priced SUS447, SUS304 than the SUS316 and SUS316L, and the like.

The metal substrate made of a low-price material allows reducing titanium usage compared with using pure titanium and a titanium alloy for the metal substrate, thus allowing the cost reduction.

While not limited, the thickness of the metal substrate is usually 0.01 mm to 1.0 mm, and 0.05 mm to 0.5 mm in some embodiments.

The thickness of the metal substrate in the above-described range allows reducing the raw material cost and ensuring physical durability.

The metal substrate usually has an uneven shape for transferring $H_2$ and $O_2$ as reactant gases and a fluid, such as a cooling water as a cooling medium. A height difference in unevenness of the uneven shape of the metal substrate is usually 10 μm to 500 μm excluding the thickness of the metal substrate. In the fuel cell separator of the present disclosure, since the thicknesses of the titanium layer and a conductive layer formed on the metal substrate are thin compared with the thickness of the metal substrate, the shape of the fuel cell separator depends on the uneven shape of the metal substrate.

In the titanium layer containing titanium formed on the surface of the metal substrate, the ratio (orientation ratio) of the (100) plane to the sum of the values obtained by dividing the peak intensities of the (100) plane, the (002) plane, and the (101) plane, derived from titanium in the X-ray diffraction analysis of the separator surface, by the respective relative intensities is 16.9% or more, and 20.0% or more in some embodiments.

Here, as the measuring method in the X-ray diffraction analysis of the separator surface, a conventional measuring method is usable. Accordingly, in the measuring method in the X-ray diffraction analysis of the separator surface, the separator surface as a measurement target is a portion (which is a portion without curvature, for example, a planar portion, or a direction without curvature) appropriate for the measurement in the X-ray diffraction analysis.

Figure 1B:
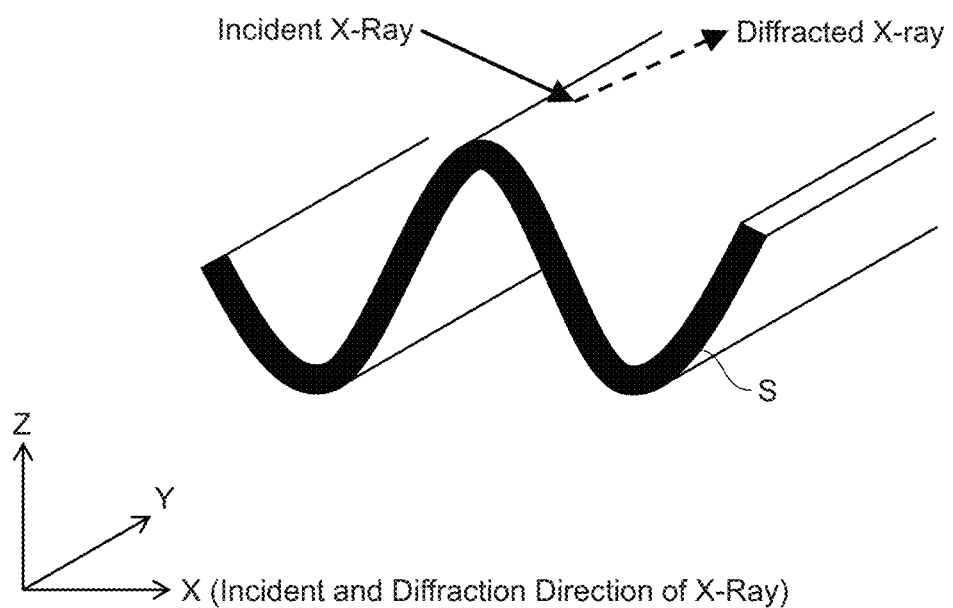
FIG. 1B is a schematic diagram illustrating an inappropriate example in the measuring method of the X-ray diffraction analysis of the separator surface having the channel shape.

For example, when the separator as the measurement target has a channel shape, an incident X-ray enters the separator such that a diffracted X-ray does not include (or eliminates) information on the curvature of the separator channel. As one example, FIG. 1A and FIG. 1B respectively illustrate an appropriate example and an inappropriate example in the measuring method in the X-ray diffraction analysis of the separator surface having the channel shape. In FIG. 1A and FIG. 1B, S indicates a cross-sectional surface of the channel shape of the separator. In FIG. 1A, the X-ray enters a protruding portion (top portion) of the separator in a y-axis direction (which is a direction perpendicular to a channel arrangement direction), and the entered X-ray is diffracted in the y-axis direction on the separator. In the case of FIG. 1A, since the incident X-ray enters the protruding portion of the separator in the direction perpendicular to the channel arrangement direction, the obtained diffracted X-ray is not affected by the curvature based on the channel shape of the separator. Meanwhile, in FIG. 1B, the X-ray enters the protruding portion (top portion) of the separator in an x-axis direction (which is a direction parallel to the channel arrangement direction), and the entered X-ray is diffracted in the x-axis direction on the separator. In the case of FIG. 1B, since the incident X-ray enters the protruding portion of the separator in the direction parallel to the channel arrangement direction, the obtained diffracted X-ray is possibly affected by the curvature based on the channel shape of the separator. Accordingly, in the measuring method in the X-ray diffraction analysis of the separator surface of the present disclosure, the measuring method of FIG. 1A is employed when the separator has the channel shape.

The relative intensity of each lattice plane derived from titanium means a theoretical diffraction intensity (theoretical value of diffraction intensity), and is a typical theoretical value that can be calculated from a crystalline structure of titanium. That is, the relative intensity of the (100) plane derived from titanium is a diffraction intensity theoretically obtained when the (100) plane is irradiated with the X-ray, the relative intensity of the (002) plane derived from titanium is a diffraction intensity theoretically obtained when the (002) plane is irradiated with the X-ray, and the relative intensity of the (101) plane derived from titanium is a diffraction intensity theoretically obtained when the (101) plane is irradiated with the X-ray. Here, the lattice planes are irradiated with the same X-ray. Therefore, the relative intensities of the respective lattice planes derived from titanium can be also expressed as a ratio of the theoretical diffraction intensities of the respective lattice planes (that is, theoretical diffraction intensity of (100) plane: theoretical diffraction intensity of (002) plane: theoretical diffraction intensity of (101) plane) obtained when the lattice planes are irradiated with the same X-ray. Since the relative intensities of the respective lattice planes derived from titanium are theoretical diffraction intensities in the irradiation with the same X-ray, they are characteristic values basically independent of the used XRD device and X-ray type insofar as the XRD is measured using the same X-ray.

Accordingly, for example, when the relative intensity of the (101) plane derived from titanium is assumed to be 100, the relative intensity of the (100) plane derived from titanium can be calculated to be 25, and the relative intensity of the (002) plane derived from titanium can be calculated to be 30 (that is, theoretical diffraction intensity of (100) plane: theoretical diffraction intensity of (002) plane: theoretical diffraction intensity of (101) plane=25:30:100).

As described above, the ratio (orientation ratio) of the (100) plane to the sum of the values obtained by dividing the peak intensities of the (100) plane, the (002) plane, and the (101) plane, which are derived from titanium, by the respective relative intensities is expressed by the formula below.

ratio (orientation ratio) of (100) plane (%)={((100) plane peak intensity/(100) plane relative intensity)/[((100) plane peak intensity/(100) plane relative intensity)+((002) plane peak intensity/(002) plane relative intensity)+((101) plane peak intensity/(101) plane relative intensity)]}×100

Furthermore, in the titanium layer containing titanium formed on the surface of the metal substrate, a ratio (orientation ratio) of the (002) plane, which is derived from titanium, to the sum of the values obtained by dividing the peak intensities of the (100) plane, the (002) plane, and the (101) plane, which are derived from titanium in the X-ray diffraction analysis of the separator surface, by the respective relative intensities is usually 61.0% or less, and 40.0% or less in some embodiments.

The ratio (orientation ratio) of the (002) plane, which is derived from titanium, to the sum of the values obtained by dividing the peak intensities of the (100) plane, the (002) plane, and the (101) plane, which are derived from titanium, by the respective relative intensities is expressed by the formula below similarly to the above description.

ratio (orientation ratio) of (002) plane (%)={((002) plane peak intensity/(002) plane relative intensity)/[((100) plane peak intensity/(100) plane relative intensity)+((002) plane peak intensity/(002) plane relative intensity)+((101) plane peak intensity/(101) plane relative intensity)]}×100

In the titanium layer containing titanium formed on the surface of the metal substrate, the peak intensities of the (100) plane, the (002) plane, and the (101) plane, which are derived from titanium in the X-ray diffraction analysis of the separator surface, are divided by the respective relative intensities, and summed. The ratio (orientation ratio) of the (100) plane and/or the (002) plane to the sum has the value in the above-described range. This provides the fuel cell separator with a high corrosion resistance. The corrosion resistance can be confirmed with an iron (Fe) dissolution amount in a dissolution test of the fuel cell separator.

Figure 2:
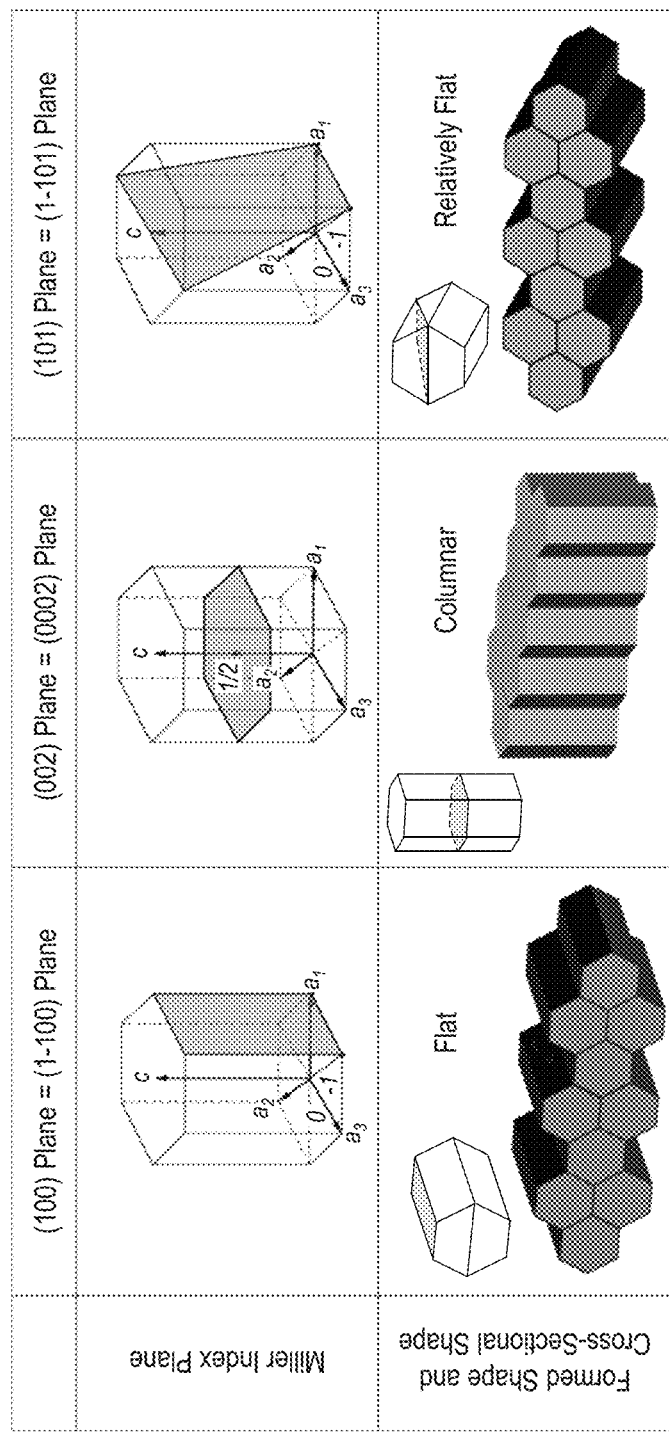
FIG. 2 is a schematic diagram illustrating Miller index planes, formed shapes, and cross-sectional shapes of a (100) plane, a (002) plane, and a (101) plane derived from titanium.

FIG. 2 is a schematic diagram illustrating Miller index planes, formed shapes, and cross-sectional shapes of the (100) plane, the (002) plane, and the (101) plane derived from titanium. From FIG. 2, the increase of the ratio of the (100) plane derived from titanium means that the ratio of titanium with a flat structure increases in the titanium layer, and the decrease of the ratio of the (002) plane derived from titanium means that the ratio of titanium with a columnar structure decreases in the titanium layer.

The titanium layer containing titanium formed on the surface of the metal substrate may contain other component(s), such as C, N, H, O, Ar, Ag, Mo, Rh, Pd, Pt, Pb, Ru, Al, Ni, and Co, insofar as the orientation ratio of the (100) plane derived from titanium in the X-ray diffraction analysis of the separator surface is in the above-described range. The titanium layer containing titanium is a titanium layer made of titanium in some embodiments.

The corrosion resistance is ensured by the titanium layer containing titanium formed on the surface of the metal substrate.

The thickness of the titanium layer is not limited because the thickness of the titanium layer depends on the performance required for each portion of the fuel cell separator, for example, a conductive portion and a sealing member arrangement portion. However, in the portion that requires the corrosion resistance, such as the conductive portion, the average thickness is 30 nm to 800 nm, and 50 nm to 300 nm in some embodiments. The average thickness of the titanium layer can be calculated from, for example, an average value in a scanning electron microscope (SEM) observation of the cross-sectional surface.

The thickness of the titanium layer in the above-described range allows obtaining an effect of titanium usage reduction and allows obtaining the desired corrosion resistance.

The fuel cell separator of the present disclosure usually includes a conductive layer for ensuring the conductive property on the surface of the titanium layer.

The conductive layer may be one known in the technical field, and may be, for example, a carbon layer.

The fuel cell separators of the present disclosure are components of a fuel cell (unit cell), and disposed on both surfaces of a membrane electrode assembly (an electrolyte membrane, and electrode layers of an anode and a cathode disposed on both surfaces of the electrolyte membrane).

The fuel cell that includes the separators manufactured by the present disclosure can be used in various electrochemical devices, such as a solid polymer fuel cell.

The fuel cell separator of the present disclosure in which the titanium layer containing titanium is formed on the metal substrate can be manufactured by forming the titanium layer on the metal substrate using a sputtering method under a condition where (a) a UBM coil current value or (b) a bias voltage value to the metal substrate is controlled within a constant range.

Here, as the metal substrate, the one described above can be used.

As the metal substrate, a metal substrate having an uneven shape preliminarily pressed in a final shape of the fuel cell separator is used in some embodiments.

By the use of the preliminarily pressed metal substrate having the uneven shape as the metal substrate, the fuel cell separator can be obtained without an additional pressing after the formation of the titanium layer and the conductive layer.

The sputtering method is a kind of Physical Vapor Deposition (PVD) method, and the sputtering method includes an unbalanced magnetron sputtering method (UBMS).

The unbalanced magnetron sputtering (UBMS) method is a sputtering method in which a magnetic field of a sputtering cathode is purposely made unbalanced to enhance plasma irradiation to the substrate, and allows forming a fine thin membrane.

In the sputtering method, as the conditions other than the conditions described below, for example, initial vacuum in a device chamber, a cleaning condition (for example, a condition of argon bombardment treatment) of the metal substrate surface, a condition of a plasma generation gas, a film formation time, and a film formation temperature, the conditions known in the technical field (for example, see WO 2015/068776) can be used. Since the film thickness becomes thicker as the film formation time increases, by adjusting the film formation time, the desired film thickness can be obtained.

In the sputtering method, (a) the UBM coil current value that controls the plasma intensity is 6.5 A to 10 A, and 7.0 A to 9.0 A in some embodiments.

By setting the UBM coil current value in the sputtering method in the above-described range, the titanium particles as film-forming particles can reach the metal substrate in a high energy state. Therefore, even when the metal substrate having the uneven shape is used as the metal substrate, the fuel cell separator with high corrosion resistance that includes the fine titanium layer on all of the protruding portions (top portions), the recessed portions (bottom portions), and the oblique portions between the protruding portions and the recessed portions of the metal substrate can be stably obtained. Especially, the fuel cell separator with high corrosion resistance in which the ratio (orientation ratio) of the (100) plane and/or the (002) plane to the sum of the values obtained by dividing the peak intensities of the (100) plane, the (002) plane, and the (101) plane, which are derived from titanium in the X-ray diffraction analysis of the separator surface, by the respective relative intensities has the value in the above-described range can be stably obtained.

Furthermore or alternatively, in the sputtering method, (b) the bias voltage to the metal substrate is more than −700 V and −150 V or less. In the unbalanced magnetron sputtering method, a glow discharge is generated between a target (that is, titanium) as the cathode (negative electrode) and the metal substrate as the anode (positive electrode) to generate inert gas plasma, for example, Ar plasma, and Ar ions ionized to positive in the Ar plasma sputter target atoms to accelerate the target atoms, thus forming the film on the metal substrate surface. Therefore, as the bias voltage, a minus (negative) voltage is applied to the metal substrate. In this description, in the expression of high/low of the negative bias voltage, the bias voltage closer to 0 V is expressed as that "the bias voltage is high."

When the metal substrate having the uneven shape is used as the metal substrate, the lower the bias voltage to the metal substrate in the sputtering method is, the thinner the thickness of the titanium layer formed in the oblique portion between the protruding portion and the recessed portion tends to become. Accordingly, by setting the bias voltage to the metal substrate in the sputtering method in the above-described range, the titanium particles as film-forming particles can reach the metal substrate in a high energy state. Therefore, even when the metal substrate having the uneven shape is used as the metal substrate, the fuel cell separator with high corrosion resistance that includes the fine titanium layer on all of the protruding portions (top portions), the recessed portions (bottom portions), and the oblique portions between the protruding portions and the recessed portions of the metal substrate can be stably obtained. Especially, the fuel cell separator with high corrosion resistance in which the ratio (orientation ratio) of the (100) plane and/or the (002) plane to the sum of the values obtained by dividing the peak intensities of the (100) plane, the (002) plane, and the (101) plane, which are derived from titanium in the X-ray diffraction analysis of the separator surface, by the respective relative intensities has the value in the above-described range can be stably obtained.

In the sputtering method, a distance between the titanium target as a titanium raw material and the metal substrate, especially the protruding portion (top portion) of the metal substrate is usually 10 cm±1 cm.

The method for manufacturing the fuel cell separator of the present disclosure usually further includes a step of forming the conductive layer that ensures the conductive property on the surface of the titanium layer.

For the step of forming the conductive layer, for example, a carbon layer, a step known in the technical field, for example, an arc ion plating (AIP) method can be used.

EXAMPLES

While the following describes some examples according to the present disclosure, it is not intended to limit the present disclosure to these examples.

Example 1: Comparative Experiment Between Corrosion Resistance OK Product and Corrosion Resistance NG Product As the metal substrate, a stainless steel (SUS304) preliminarily pressed in the shape of the fuel cell separator was used. After removing a passivation layer on the SUS surface by Ar etching, the titanium layer was formed on the SUS using the sputtering method, and subsequently, the carbon layer as the conductive layer was formed on the titanium layer using the AIP method, thus manufacturing the fuel cell separator. A metal dissolution amount test as an evaluation of the corrosion resistance was performed on the obtained fuel cell separator. Among the fuel cell separators, a separator (OK product) having the small metal dissolution amount and a separator (NG product) having a large iron (Fe) dissolution amount were selected. Subsequently, the crystalline structure of the titanium layer was evaluated with SEM and XRD for each of the OK product and the NG product.

Here, in the metal dissolution amount test as the corrosion resistance evaluation, a constant potential corrosion test in accordance with "Method for high-temperature electrochemical corrosion test of metallic materials in molten salts" (JIS Z2294) in Japanese Industrial Standards was performed. Specifically, an electric potential of 0.9 V vs. SHE was kept constant in a state where samples were each immersed in a sulfuric acid aqueous solution adjusted to the temperature at 80° C., and after the constant potential corrosion test, the metal dissolution amount of the metal substrate component of the separator dissolved into the sulfuric acid aqueous solution was measured from a difference of metal amount between the solutions before and after the test using an ICP analyzer. The sulfuric acid aqueous solution in which NaF was dissolved so as to have a fluoride ion concentration of 3 ppm was used. The time period of the constant potential corrosion test was 60 hours.

As described above, the XRD was measured in the y-axis direction at the protruding portion (top portion) of the separator by the method described in FIG. 1A. For the XRD, SmartLab (X-ray: CuKα) manufactured by Rigaku Corporation was used.

Figure 3:
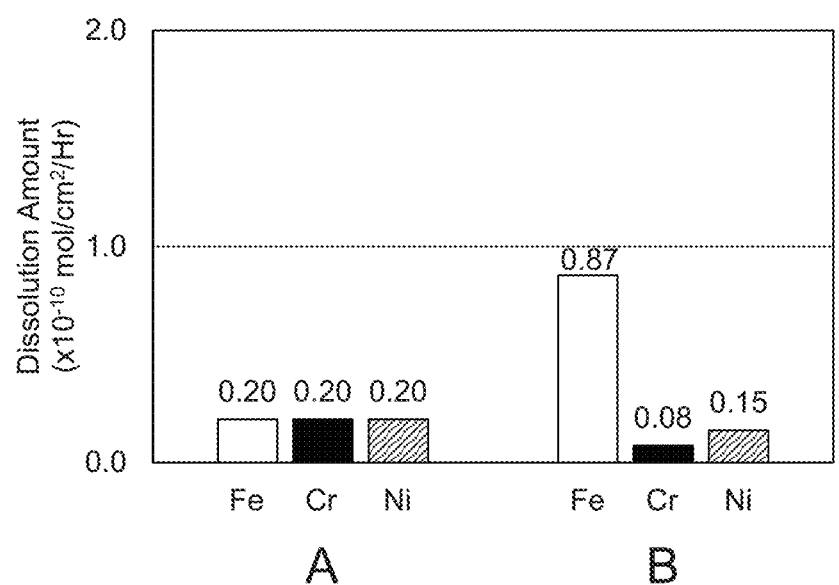
FIG. 3 is a graph illustrating dissolution amounts of iron (Fe), chromium (Cr), and nickel (Ni) of A) OK product and B) NG product in Example 1.
Figure 4A:
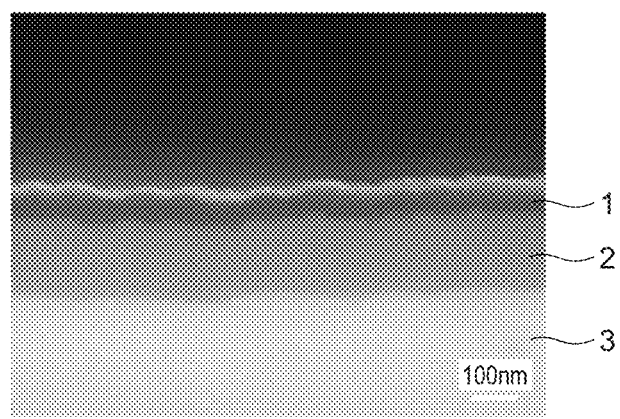
FIG. 4A is an SEM image of the OK product in Example 1.
Figure 4B:
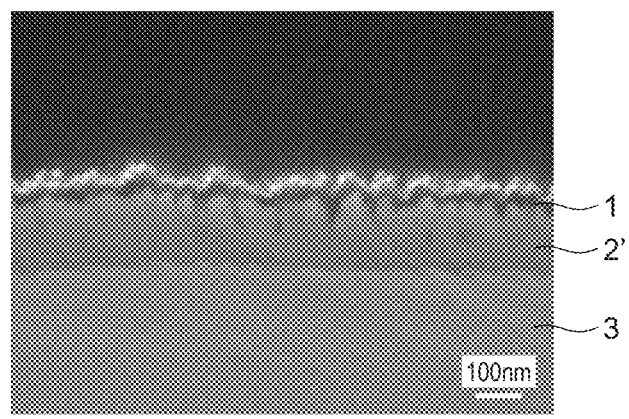
FIG. 4B is an SEM image of the NG product in Example 1.
Figure 5A:
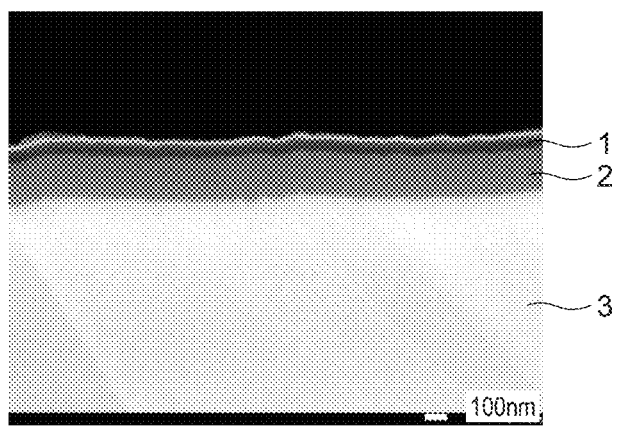
FIG. 5A is an SEM image of the OK product in Example 1.
Figure 5B:
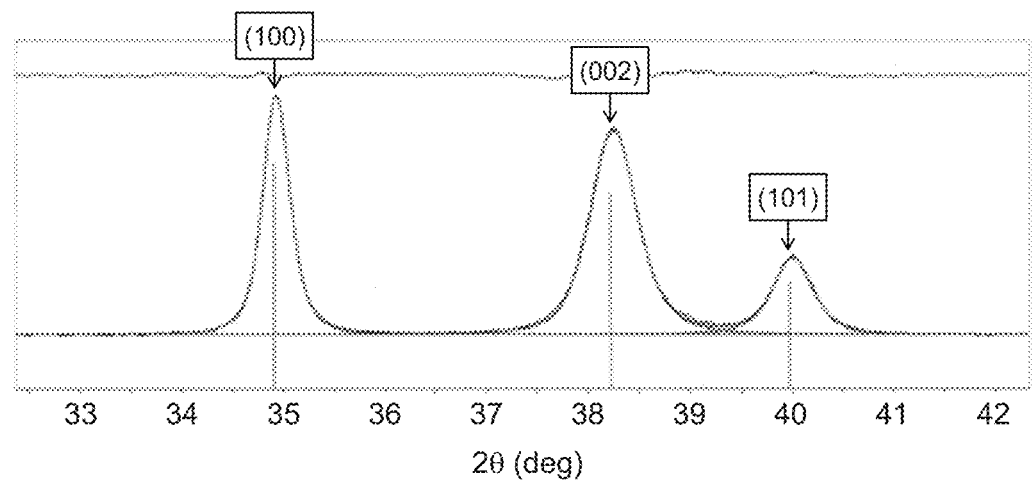
FIG. 5B illustrates an XRD diffraction pattern of a titanium layer of the OK product in Example 1.
Figure 6A:
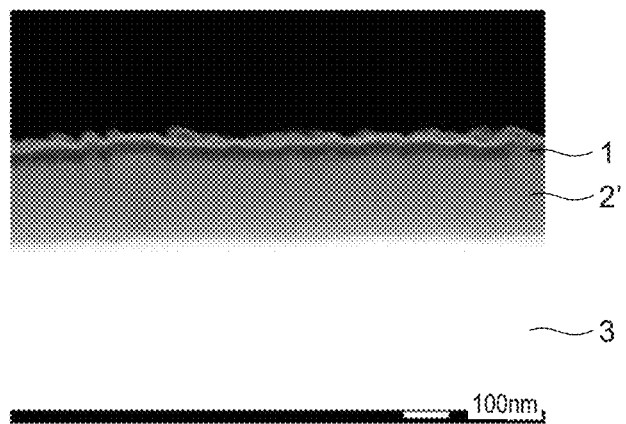
FIG. 6A is an SEM image of the NG product in Example 1.
Figure 6B:
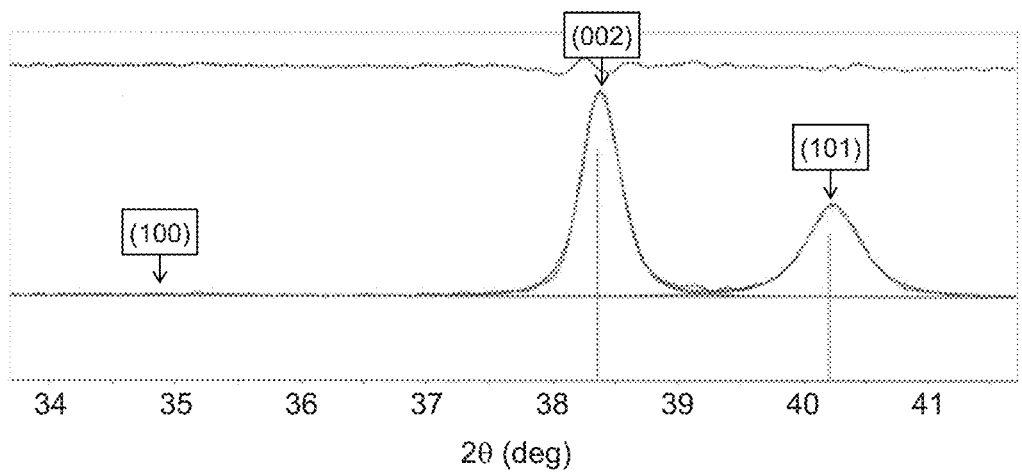
FIG. 6B illustrates an XRD diffraction pattern of a titanium layer of the NG product in Example 1.

The results are illustrated in FIG. 3 to FIG. 6B. In FIG. 3, A) indicates the dissolution amounts of iron (Fe), chromium (Cr), and nickel (Ni) of the OK product, and B) indicates the dissolution amounts of iron (Fe), chromium (Cr), and nickel (Ni) of the NG product. FIG. 4A illustrates a SEM image of the OK product, and FIG. 4B illustrates a SEM image of the NG product. FIG. 5A illustrates a SEM image of the OK product, and FIG. 5B illustrates an XRD diffraction pattern of the titanium layer of the OK product. FIG. 6A illustrates a SEM image of the NG product, and FIG. 6B illustrates an XRD diffraction pattern of the titanium layer of the NG product. In FIG. 4A to FIG. 6B, the numeral 1 indicates the carbon layer, the numeral 2 indicates the titanium layer (which is a layer in which the flat structure was observed, hereinafter referred to as a flat structure), the numeral 2' indicates the titanium layer (which is a layer in which the flat structure was not observed, or in which the peak of the flat structure was small while the flat structure was observed, hereinafter referred to as a columnar structure), and the numeral 3 indicates the metal substrate.

From FIG. 3 to FIG. 6B, it was seen that the OK product having the small metal dissolution amount had the titanium layer (flat structure) (2) in which the (100) plane was observed in the XRD diffraction pattern, and the NG product having the large iron (Fe) dissolution amount had the titanium layer (columnar structure) (2') in which the (100) plane was not observed or the peak of the (100) plane was small while the (100) plane was observed in the XRD.

Accordingly, it was seen that the fuel cell separator with high corrosion resistance and low metal dissolution amount was obtained when titanium having the flat structure increased and titanium having the columnar structure decreased in the titanium layer (2, 2').

Example 2: Relation Between Orientation Ratio of (100) Plane and Iron (Fe) Dissolution Amount As the metal substrate, a stainless steel (SUS304) preliminarily pressed in the shape of the fuel cell separator was used. After removing a passivation layer on the SUS surface by Ar etching, the titanium layer was formed on the SUS using the sputtering method, and subsequently, the carbon layer as the conductive layer was formed on the titanium layer using the AIP method, thus manufacturing the fuel cell separator. The above-described metal dissolution amount test was performed on the obtained fuel cell separator, and furthermore, the crystalline structure of the titanium layer was evaluated by the XRD.

From the result of the XRD diffraction pattern, the orientation ratios of the (100) plane, the (002) plane, and the (101) plane, which were derived from titanium, of each fuel cell separator were calculated as described above. As one example, the calculation method of the orientation ratios of the respective lattice planes derived from titanium of one fuel cell separator is described below.

(1) Using the X-ray diffraction (XRD) diffractometer (SmartLab (manufactured by Rigaku Corporation), X-ray: CuKα), the protruding portion (top portion) of the channel of the fuel cell separator was analyzed by the method described in FIG. 1A.

(2) Respective peaks of the (100) plane, the (002) plane, and the (101) plane as main diffraction peaks of the detected titanium were fitted in the diffractometer, thus calculating the signal strengths of the respective peaks.

(3) Since the respective lattice planes have the mutually different peak intensities, and have relative intensities, the peak intensities of the respective lattice planes were divided by the relative intensities (theoretical diffraction intensities). Note that as a preliminary measurement for using the theoretical diffraction intensities of the respective lattice planes as the relative intensities of the respective lattice planes, the XRD of powder crystals of high purity Si was measured using the XRD diffractometer (SmartLab (manufactured by Rigaku Corporation), X-ray: CuKα) used in the measurement. Accordingly, it was confirmed that the ratio between the actually measured peak intensities of the respective lattice planes of Si became approximately the same as the ratio between the theoretical diffraction intensities.

(4) (Peak intensity/relative intensity) of each lattice plane obtained in (3) was divided by the sum of (peak intensity/relative intensity) of each lattice plane, thus calculating the orientation ratio of each lattice plane.

TABLE 1

| Calculation Example | | | |
|---|---|---|---|
| 2θ | 35 | 38 | 40 |
| θ | 17.5 | 19 | 20 |
| rad | 0.305433 | 0.331613 | 0.349066 |
| Plane Index | (100) | (002) | (101) |
| Relative Intensity | 25 | 30 | 100 |
| a. Peak Intensity (Experimental Intensity) | 0 | 72 | 11 |
| b. Experimental Intensity/Relative Intensity | 0.00 | 2.40 | 0.11 |
| Ratio of Each Lattice Plane {b/(Sum of b Values)} × 100 | 0.0 | 95.6 | 4.4 |

Figure 7:
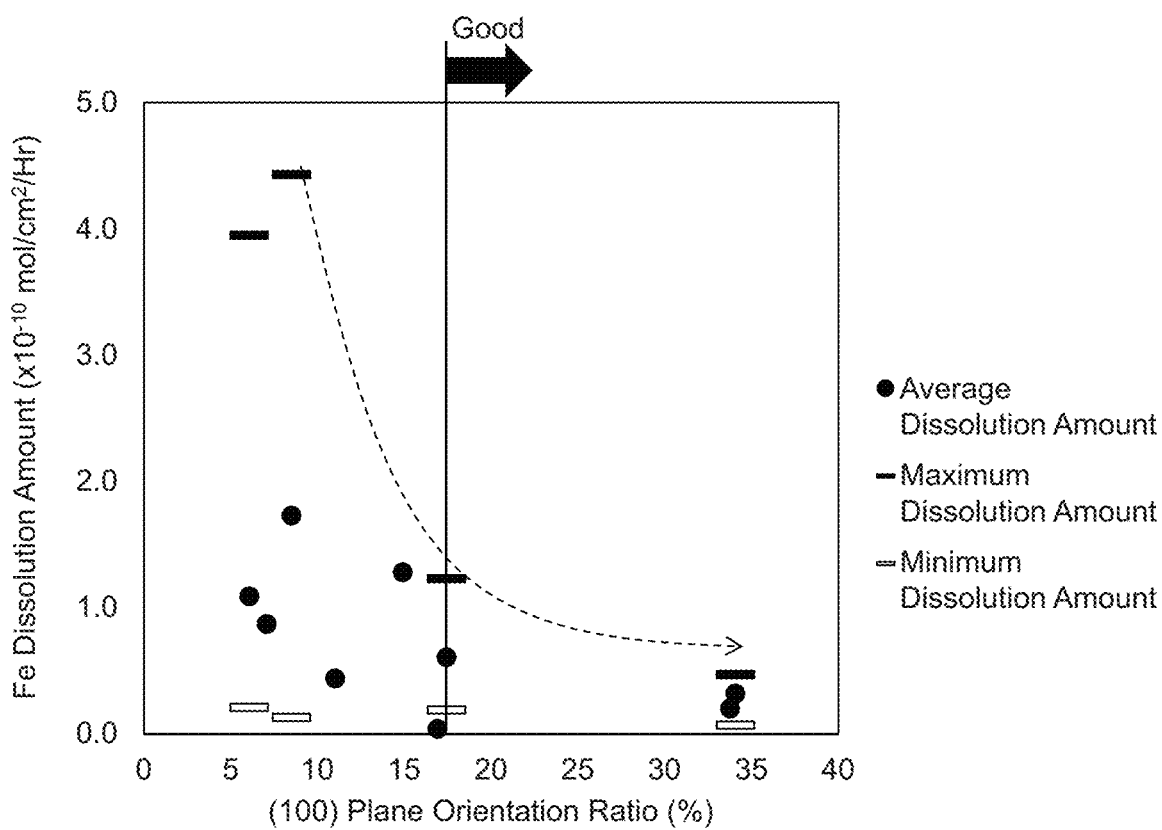
FIG. 7 is a graph illustrating a relation between an orientation ratio of a (100) plane derived from titanium and an iron (Fe) dissolution amount of a fuel cell separator in Example 2.

FIG. 7 illustrates the relation between the orientation ratio of the (100) plane derived from titanium and the iron (Fe) dissolution amount of the fuel cell separator. FIG. 7 illustrates only the average dissolution amount when the two or more fuel cell separators have the same orientation ratios of the (100) plane and the same iron (Fe) dissolution amounts, and illustrates the average dissolution amount, the maximum dissolution amount, and the minimum dissolution amount when the two or more fuel cell separators have the mutually different iron (Fe) dissolution amounts while having the same orientation ratios of the (100) plane.

From FIG. 7, it was seen that the iron dissolution amount of the fuel cell separator was stably decreased in all of the average dissolution amount, the maximum dissolution amount, and the minimum dissolution amount when the orientation ratio of the (100) plane derived from titanium of the fuel cell separator became 16.9% or more.

Example 3: Relation Between Orientation Ratio of (002) Plane and Iron (Fe) Dissolution Amount For the fuel cell separators obtained in Example 2, from the result of the XRD diffraction pattern, the orientation ratio of the (002) plane derived from titanium of each fuel cell separator was calculated as described above. For the calculation method of the orientation ratio of the (002) plane derived from titanium of one fuel cell separator as one example, see Table 1.

Figure 8:
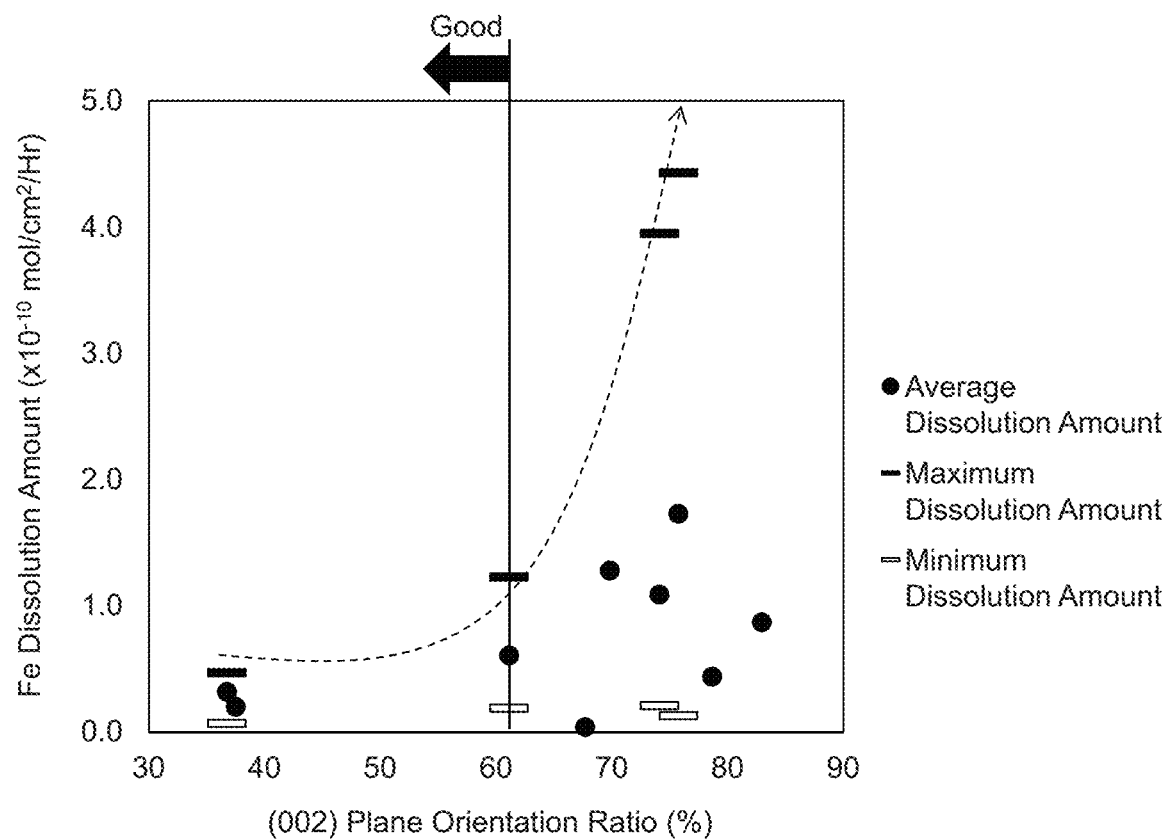
FIG. 8 is a graph illustrating a relation between an orientation ratio of a (002) plane derived from titanium and an iron (Fe) dissolution amount of a fuel cell separator in Example 3.

FIG. 8 illustrates the relation between the orientation ratio of the (002) plane derived from titanium and the iron (Fe) dissolution amount of the fuel cell separator. FIG. 8 illustrates only the average dissolution amount when the two or more fuel cell separators have the same orientation ratio of the (002) plane and the same iron (Fe) dissolution amount, and illustrates the average dissolution amount, the maximum dissolution amount, and the minimum dissolution amount when the two or more fuel cell separators have the mutually different iron (Fe) dissolution amounts while having the same orientation ratio of the (002) plane.

From FIG. 8, it was seen that the iron dissolution amount of the fuel cell separator was stably decreased in all of the average dissolution amount, the maximum dissolution amount, and the minimum dissolution amount when the orientation ratio of the (002) plane derived from titanium of the fuel cell separator became 61.0% or less.

Example 4: Film Formation Experiment 1 of Titanium Layer on Metal Substrate Having Uneven Shape As the metal substrate, a stainless steel (SUS304) having the uneven shape preliminarily pressed in the shape of the fuel cell separator was used. After removing a passivation layer on the SUS surface by Ar etching, the titanium layer was formed on the SUS using the sputtering method under the condition that the UBM coil current value was 4.0 A and the bias voltage to the metal substrate was −75 V, and subsequently, the carbon layer as the conductive layer was formed on the titanium layer using the AIP method, thus manufacturing the fuel cell separator.

Figure 9:
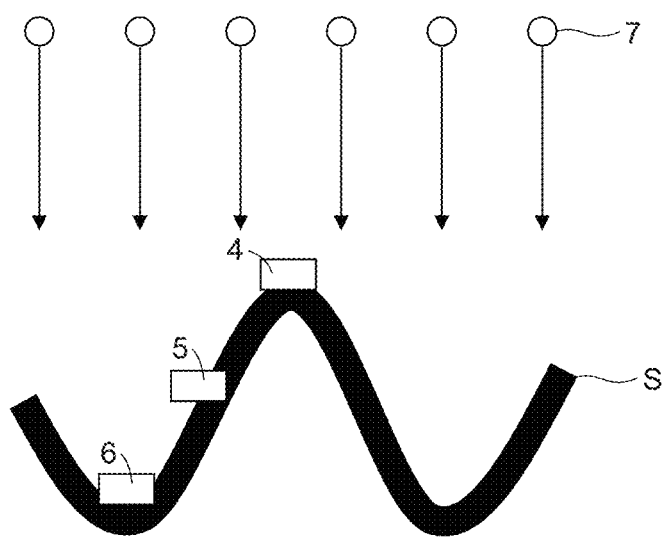
FIG. 9 is a drawing schematically illustrating a state where titanium particles as film-forming particles are formed into a film on a metal substrate having an uneven shape using a sputtering method in Example 4.

FIG. 9 schematically illustrates a state where titanium particles as film-forming particles are formed into a film on the metal substrate having the uneven shape using the sputtering method. In FIG. 9, the numeral 4 indicates the protruding portion (top portion), the numeral 5 indicates the oblique portion between the protruding portion and the recessed portion, the numeral 6 indicates the recessed portion (bottom portion), S indicates the cross-sectional surface of the separator channel shape, and the numeral 7 indicates the film-forming particles (titanium particles).

Figure 10:
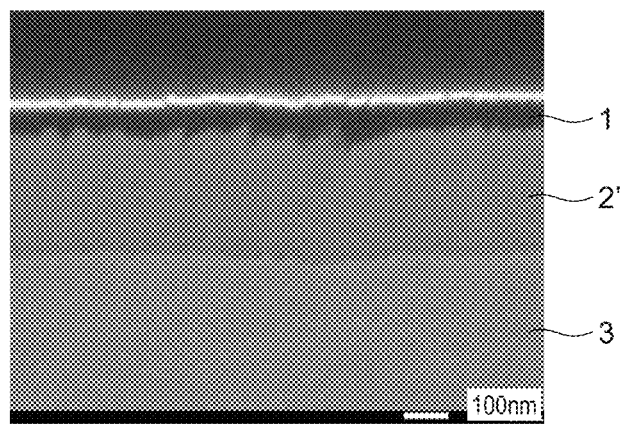
FIG. 10 illustrates SEM images of a protruding portion (4), an oblique portion (5) between a protruding portion and a recessed portion, and a recessed portion (6) of a fuel cell separator in Example 4.
Figure 10:
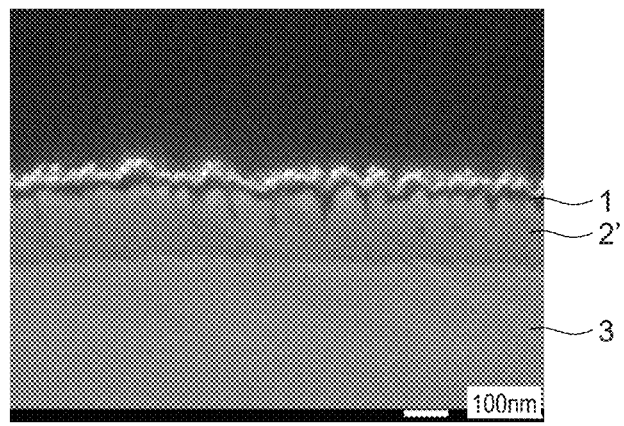
Figure 10:
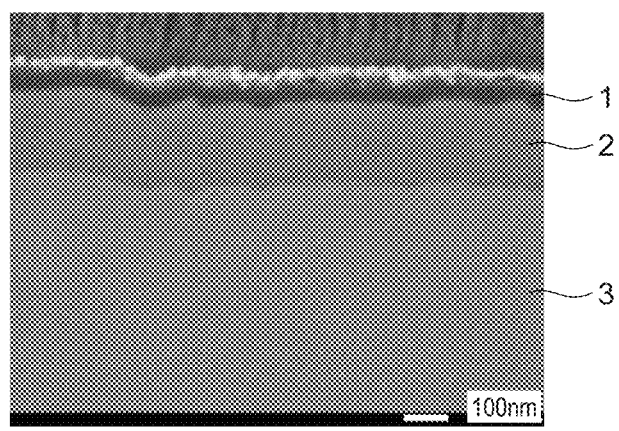

For the obtained fuel cell separator, the SEM images of the protruding portions (4), the oblique portions (5) between the protruding portions and the recessed portions, and the recessed portions (6) were measured. FIG. 10 illustrates the results of the SEM images of the respective portions. In FIG. 10, the numeral 1 indicates the carbon layer, the numeral 2 indicates the titanium layer (flat structure), the numeral 2' indicates the titanium layer (columnar structure), and the numeral 3 indicates the metal substrate.

From FIG. 10, it was seen that the protruding portion (4) and the oblique portion (5) between the protruding portion and the recessed portion had the titanium layer (columnar structure) (2') and the recessed portion (6) had the titanium layer (flat structure) (2). That is, it was seen that when the metal substrate (3) had the uneven shape, the titanium layer (2, 2') to be formed was different depending on the portion of the metal substrate (3).

That is, it was seen that, in the method such as the sputtering method with which a highly crystalline metal film was formed, the titanium layer (columnar structure) (2') that could be a starting point of the dissolution was easily formed, and furthermore, in a complicated structure having unevenness like the separator channel shape, formation of the titanium layer (columnar structure) (2') was promoted in the portion in which the energy of the particles (7) was less likely to reach like the oblique portion (5) as illustrated in FIG. 9.

Example 5: Film Formation Experiment 2 of Titanium Layer on Metal Substrate Having Uneven Shape As the metal substrate, a stainless steel (SUS304) having the uneven shape preliminarily pressed in the shape of the fuel cell separator was used. After removing a passivation layer on the SUS surface by Ar etching, the titanium layer was formed on the SUS using the sputtering method under the condition that the UBM coil current value was 6.5 A and the bias voltage to the metal substrate was 0 V, −50 V, or −250 V, and subsequently, the carbon layer as the conductive layer was formed on the titanium layer using the AIP method, thus manufacturing the fuel cell separator.

Figure 11:
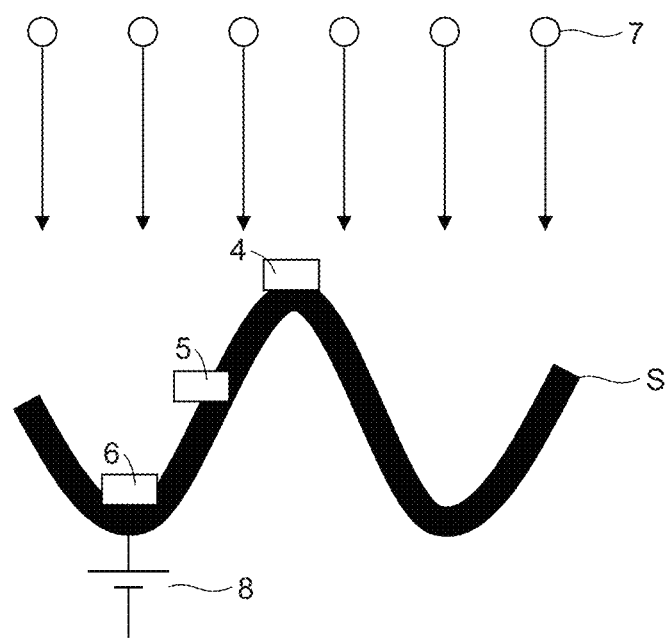
FIG. 11 is a drawing schematically illustrating a state where titanium particles as film-forming particles are formed into a film on a metal substrate having an uneven shape using a sputtering method under a condition where a bias voltage value to the metal substrate is variously changed in Example 5.

FIG. 11 schematically illustrates a state where titanium particles as film-forming particles are formed into a film on the metal substrate having the uneven shape using the sputtering method under the condition that the bias voltage value to the metal substrate is variously changed. In FIG. 11, the numeral 4 indicates the protruding portion (top portion), the numeral 5 indicates the oblique portion between the protruding portion and the recessed portion, the numeral 6 indicates the recessed portion (bottom portion), S indicates the cross-sectional surface of the separator channel shape, the numeral 7 indicates the film-forming particles (titanium particles), and the numeral 8 indicates a power source for applying the bias voltage to the metal substrate.

Figure 12:
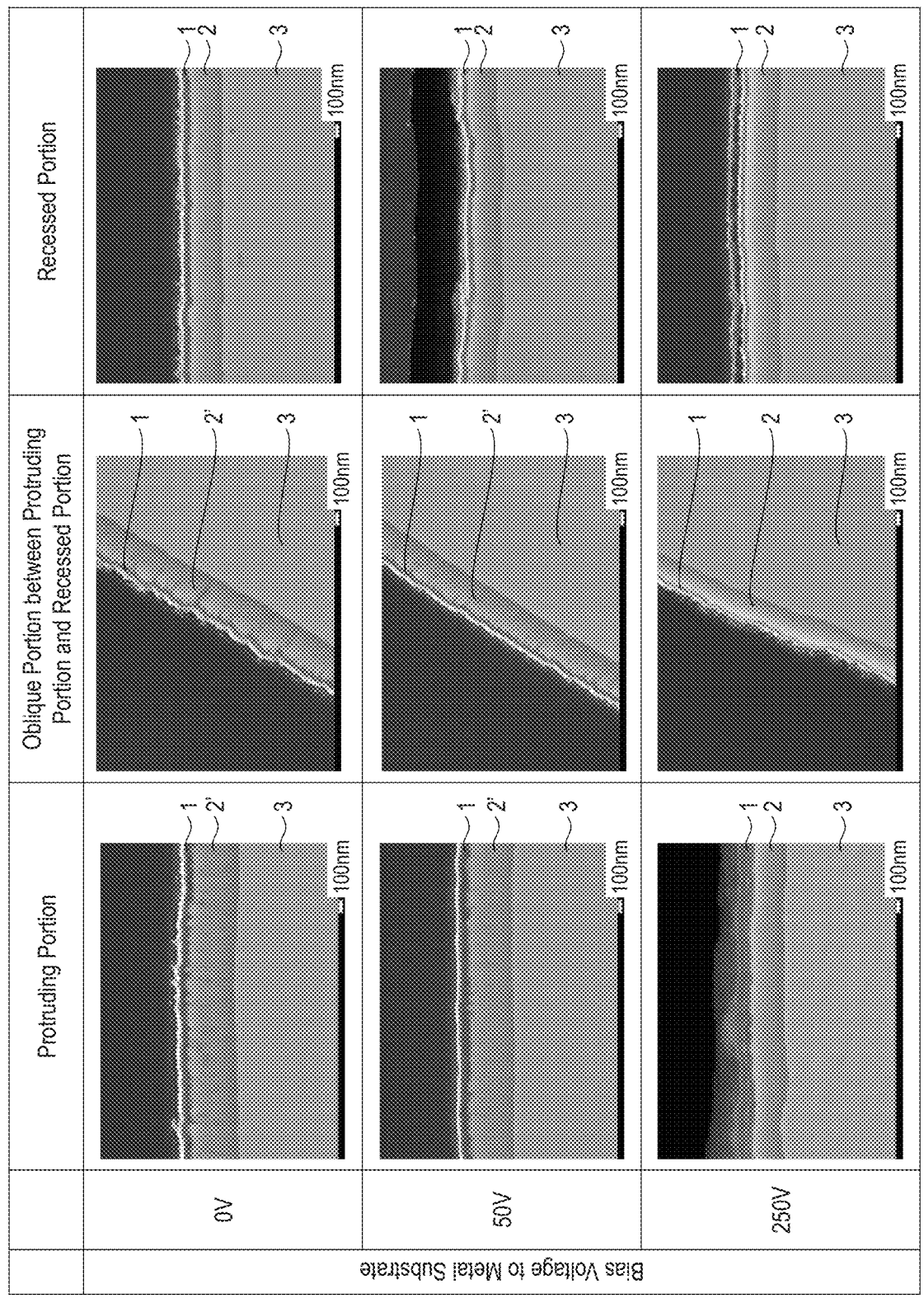
FIG. 12 illustrates SEM images of respective portions of the fuel cell separator in Example 5 for each bias voltage value to the metal substrate.

For the obtained fuel cell separator, the SEM images of the protruding portions (4), the oblique portions (5) between the protruding portions and the recessed portions, and the recessed portions (6) were measured. FIG. 12 illustrates the results of the SEM images of the respective portions for each bias voltage value to the metal substrate. In FIG. 12, the numeral 1 indicates the carbon layer, the numeral 2 indicates the titanium layer (flat structure), the numeral 2' indicates the titanium layer (columnar structure), and the numeral 3 indicates the metal substrate.

Figure 13:
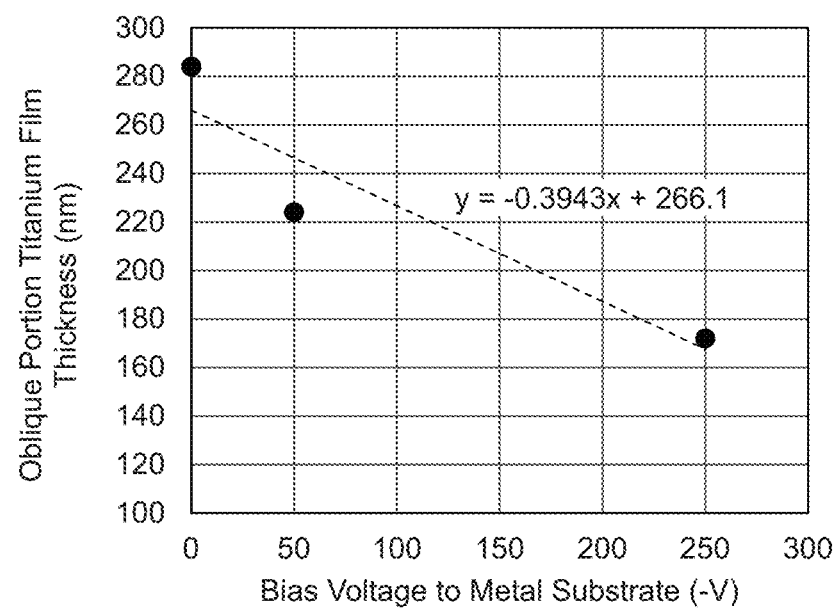
FIG. 13 is a graph illustrating a relation between the bias voltage (unit: −V) to the metal substrate (3) and a thickness of an oblique portion measured from results of the SEM images in FIG. 12 in Example 5.

Furthermore, FIG. 13 illustrates a relation between the bias voltage (unit: −V) to the metal substrate (3) and the thickness of the oblique portion measured from the results of the SEM images in FIG. 12.

From FIG. 12, it was seen that, when the metal substrate (3) had the uneven shape, the bias voltage to the metal substrate (3) affected the crystalline structure of the titanium layer (2, 2') in the film formation of the titanium layer (2, 2'). Additionally, it was seen that, decreasing the bias voltage to the metal substrate (3) facilitated the formation of the titanium layer (flat structure) (2).

Furthermore, from FIG. 13, it was seen that decreasing the bias voltage to the metal substrate (3) also decreased the film thickness of the oblique portion (5) between the protruding portion and the recessed portion with the effect of the Ar etching. Accordingly, it was seen that the bias voltage to the metal substrate (3) of more than −700 V was required for forming the titanium layer (flat structure) (2) on the oblique portion (5).

Example 6: Film Formation Experiment 3 of Titanium Layer on Metal Substrate Having Uneven Shape As the metal substrate, a stainless steel (SUS304) having the uneven shape preliminarily pressed in the shape of the fuel cell separator was used. After removing a passivation layer on the SUS surface by Ar etching, the titanium layer was formed on the SUS using the sputtering method under the condition that the UBM coil current value and the bias voltage value to the metal substrate were variously changed, and subsequently, the carbon layer as the conductive layer was formed on the titanium layer using the AIP method, thus manufacturing the fuel cell separator.

Figure 14:
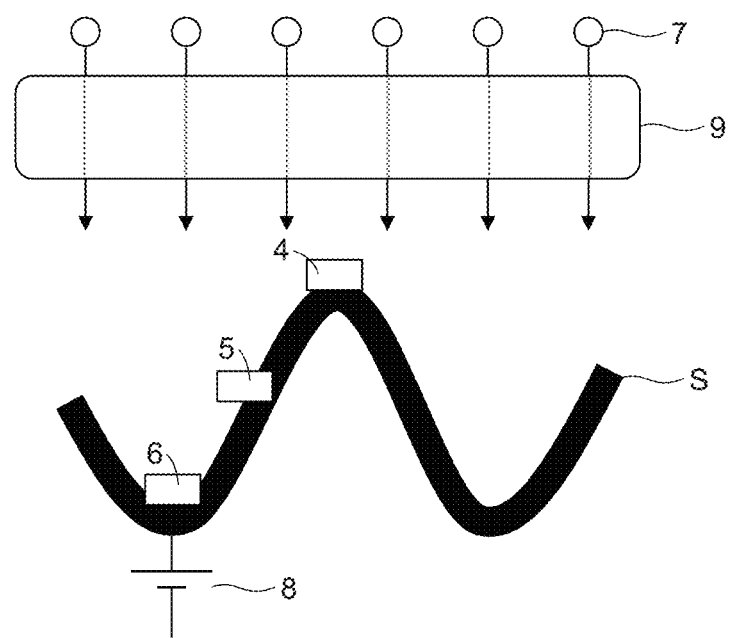
FIG. 14 is a drawing schematically illustrating a state where titanium particles as film-forming particles are formed into a film on a metal substrate having an uneven shape using a sputtering method under a condition where a UBM coil current value and a bias voltage value to the metal substrate are variously changed in Example 6.

FIG. 14 schematically illustrates a state where titanium particles as film-forming particles are formed into a film on the metal substrate having the uneven shape using the sputtering method under the condition that the UBM coil current value and the bias voltage value to the metal substrate are variously changed. In FIG. 14, the numeral 4 indicates the protruding portion (top portion), the numeral 5 indicates the oblique portion between the protruding portion and the recessed portion, the numeral 6 indicates the recessed portion (bottom portion), S indicates the cross-sectional surface of the separator channel shape, the numeral 7 indicates the film-forming particles (titanium particles), the numeral 8 indicates the power source for applying the bias voltage to the metal substrate, and the numeral 9 indicates a plasma with intensity controlled by the UBM coil current.

The metal dissolution amount test described above was performed on the obtained fuel cell separator.

Figure 15:
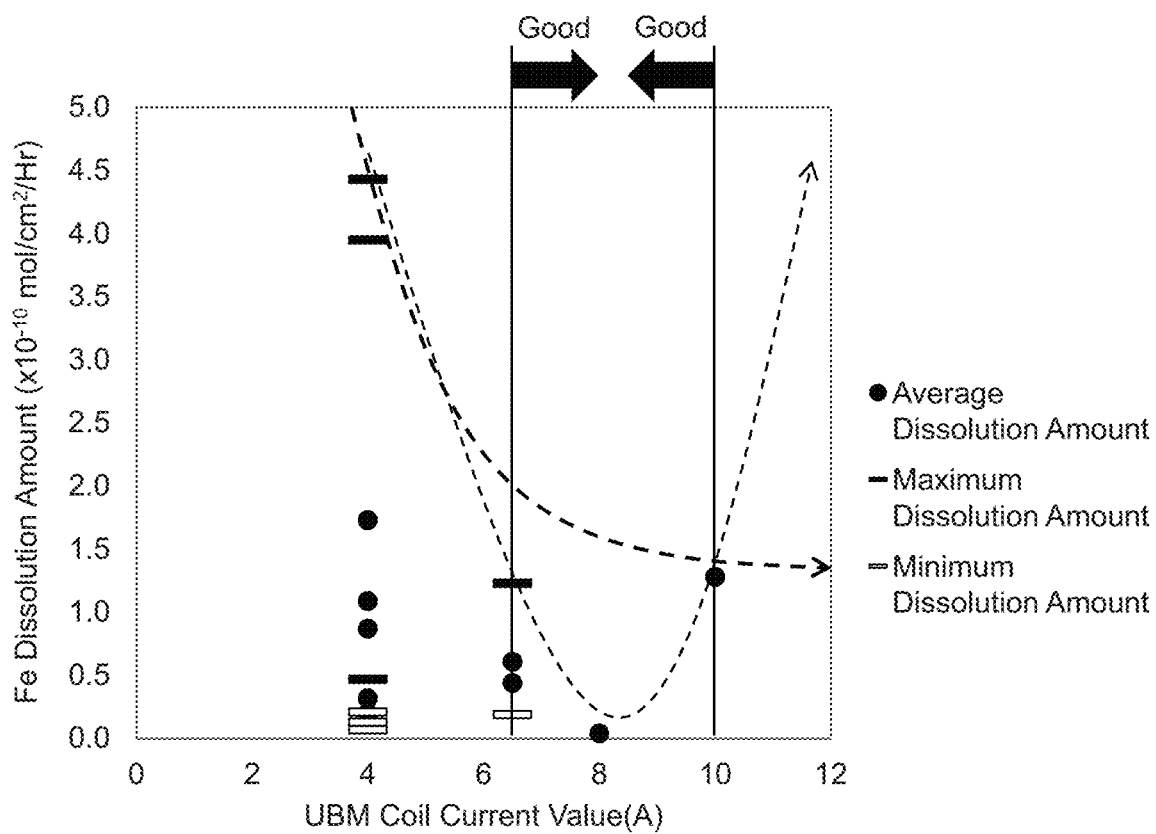
FIG. 15 is a graph illustrating a relation between the UBM coil current value and an iron (Fe) dissolution amount in Example 6.
Figure 16:
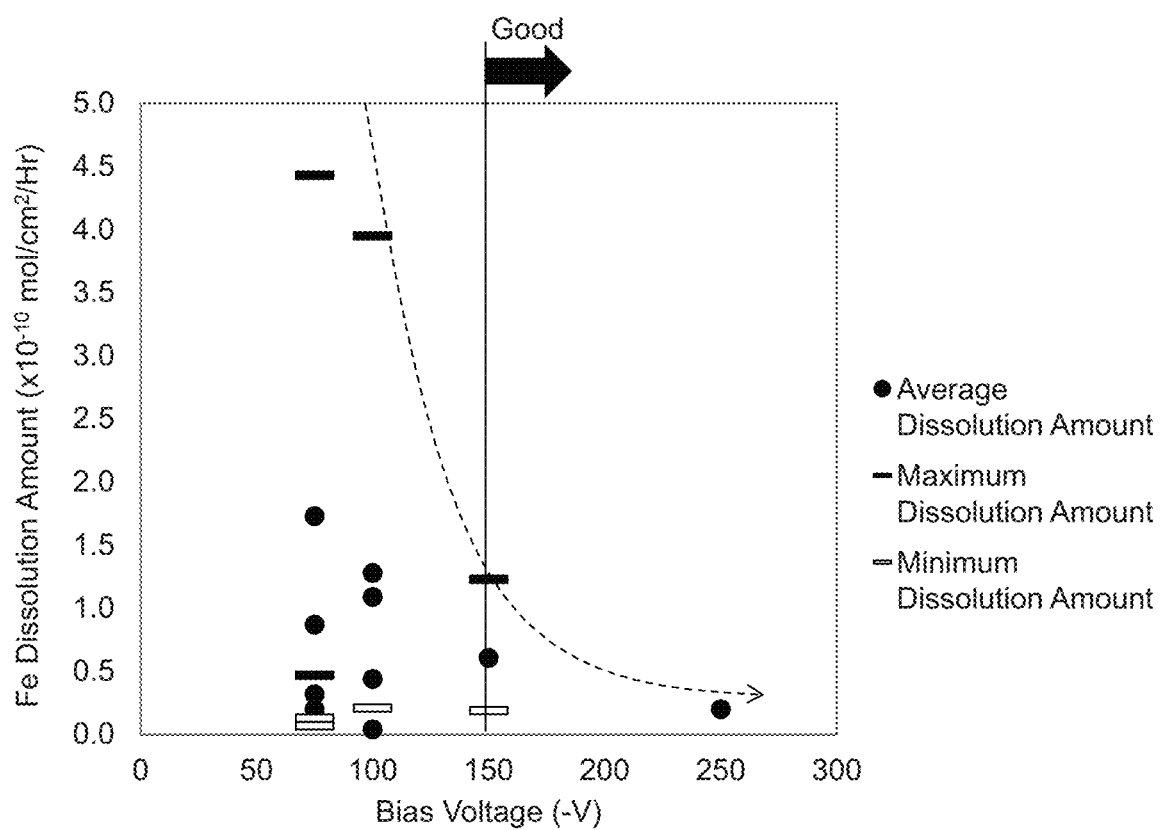
FIG. 16 is a graph illustrating a relation between the bias voltage value (unit: −V) to the metal substrate and an iron (Fe) dissolution amount in Example 6.

FIG. 15 illustrates a relation between the UBM coil current value and the iron (Fe) dissolution amount, and FIG. 16 illustrates a relation between the bias voltage value (unit: −V) to the metal substrate and the iron (Fe) dissolution amount. In FIG. 15 and FIG. 16, only the average dissolution amount is illustrated when the two or more fuel cell separators manufactured with the same UBM coil current value and the same bias voltage value to the metal substrate exhibited the same iron dissolution amount. The average dissolution amount, the maximum dissolution amount, and the minimum dissolution amount are illustrated when the two or more fuel cell separators manufactured with the same UBM coil current value and the same bias voltage value to the metal substrate exhibited the mutually different iron dissolution amounts. For example, in FIG. 15, when the UBM coil current value is 4 A, four average dissolution amounts are illustrated, and respective three maximum dissolution amounts and minimum dissolution amounts are illustrated. This is because, in the respective fuel cell separators formed with the UBM coil current value fixed to 4 A and the four different bias voltage values to the metal substrate (that is, fuel cell separators manufactured under four conditions), only the average dissolution amount is illustrated because the two or more fuel cell separators exhibited the same iron dissolution amount under the one condition, while the average dissolution amount, the maximum dissolution amount, and the minimum dissolution amount are illustrated for each of the three conditions because the two or more fuel cell separators exhibited the mutually different iron dissolution amounts under each of the three conditions. For example, in FIG. 16, when the bias voltage value to the metal substrate is −75 V, four average dissolution amounts are illustrated, and respective two maximum dissolution amounts and minimum dissolution amounts are illustrated. This is because, in the respective fuel cell separators formed with the bias voltage value to the metal substrate fixed to −75 V and the four different UBM coil current values (that is, fuel cell separators manufactured under four conditions), only the average dissolution amount is illustrated for each of the two conditions because the two or more fuel cell separators exhibited the same iron dissolution amount under each of the two conditions, while the average dissolution amount, the maximum dissolution amount, and the minimum dissolution amount are illustrated for each of the other two conditions because the two or more fuel cell separators exhibited the mutually different iron dissolution amounts under each of the other two conditions.

From FIG. 15, it was seen that the iron dissolution amount of the fuel cell separator was stably decreased in all of the average dissolution amount, the maximum dissolution amount, and the minimum dissolution amount when the UBM coil current value became 6.5 A to 10 A.

From FIG. 16, it was seen that the iron dissolution amount of the fuel cell separator was stably decreased in all of the average dissolution amount, the maximum dissolution amount, and the minimum dissolution amount when the bias voltage value to the metal substrate became −150 V or less. Accordingly, in consideration of the result of Example 5, it was seen that the bias voltage value to the metal substrate may be more than −700 V and −150 V or less.

All publications, patents and patent applications cited in the present description are herein incorporated by reference as they are.

What is claimed is:

1. A fuel cell separator comprising:
a metal substrate; and
a titanium layer containing titanium formed on the metal substrate,
wherein a ratio of a (100) plane to a sum of values obtained by dividing peak intensities of the (100) plane, a (002) plane, and a (101) plane derived from titanium in an X-ray diffraction analysis of a separator surface by respective relative intensities is 16.9% or more.

2. The fuel cell separator according to claim 1,
wherein a ratio of the (002) plane to the sum of the values obtained by dividing the peak intensities of the (100) plane, the (002) plane, and the (101) plane derived from titanium in the X-ray diffraction analysis of the separator surface by the respective relative intensities is 61.0% or less.

3. The fuel cell separator according to claim 1,
wherein the metal substrate is a stainless steel.

4. The fuel cell separator according to claim 2,
wherein the metal substrate is a stainless steel.

5. A method for manufacturing a fuel cell separator including a metal substrate and a titanium layer containing titanium formed on the metal substrate,
wherein the titanium layer is formed on the metal substrate using a sputtering method under a condition of:
  (a) a UBM coil current value is 6.5 A to 10 A; or
  (b) a bias voltage value to the metal substrate is more than −700 V and −150 V or less.

6. The method according to claim 5,
wherein the metal substrate has an uneven shape.

* * * * *